US006950772B1

(12) United States Patent
Callway

(10) Patent No.: US 6,950,772 B1
(45) Date of Patent: Sep. 27, 2005

(54) DYNAMIC COMPONENT TO INPUT SIGNAL MAPPING SYSTEM

(75) Inventor: Edward G. Callway, Toronto (CA)

(73) Assignee: ATI International SRL, Christchurch (BB)

( * ) Notice: Subject to any disclaimer, the term of this patent is extended or adjusted under 35 U.S.C. 154(b) by 948 days.

(21) Appl. No.: 09/741,456

(22) Filed: Dec. 19, 2000

(51) Int. Cl.[7] ............................................... G06F 3/00
(52) U.S. Cl. ......................................... 702/120; 710/1
(58) Field of Search .................. 702/120, 118, 119, 702/69, 74, 182–185, 188, 190; 710/1, 5, 710/7, 18, 46; 709/208, 213, 217, 223; 714/25; 324/76.11; 725/14

(56) References Cited

U.S. PATENT DOCUMENTS

| 5,655,133 | A | * | 8/1997 | Dupree et al. ................. 712/23 |
| 5,715,197 | A | * | 2/1998 | Nance et al. ........... 365/189.02 |
| 5,937,202 | A | * | 8/1999 | Crosetto ...................... 712/19 |
| 5,990,862 | A | * | 11/1999 | Lewis .......................... 345/858 |
| 6,687,865 | B1 | * | 2/2004 | Dervisoglu et al. ......... 714/726 |

* cited by examiner

Primary Examiner—Marc S. Hoff
Assistant Examiner—Edward Raymond
(74) Attorney, Agent, or Firm—Vedder, Price, Kaufman & Kammholz, P.C.

(57) ABSTRACT

A dynamic component to input signal mapping system is disclosed that receives different types of input signals applied to a number of components and provides resultant output signals. The system includes input ports receiving the input signals, output ports providing the output signals, and a number of components processing the input signals, each of the components having at least one input and one output. The system includes a test signal source coupled to the components. Additionally, a signal analyzer coupled to an output of components analyzes response signals output from the components in response to test signals. The system is operative to map at least one component to receive at least one input signal based on the analyzed response. The system allows components on a semiconductor chip to be dynamically reconfigured for optimal processing of different types of signals, such as video and audio signals.

38 Claims, 3 Drawing Sheets

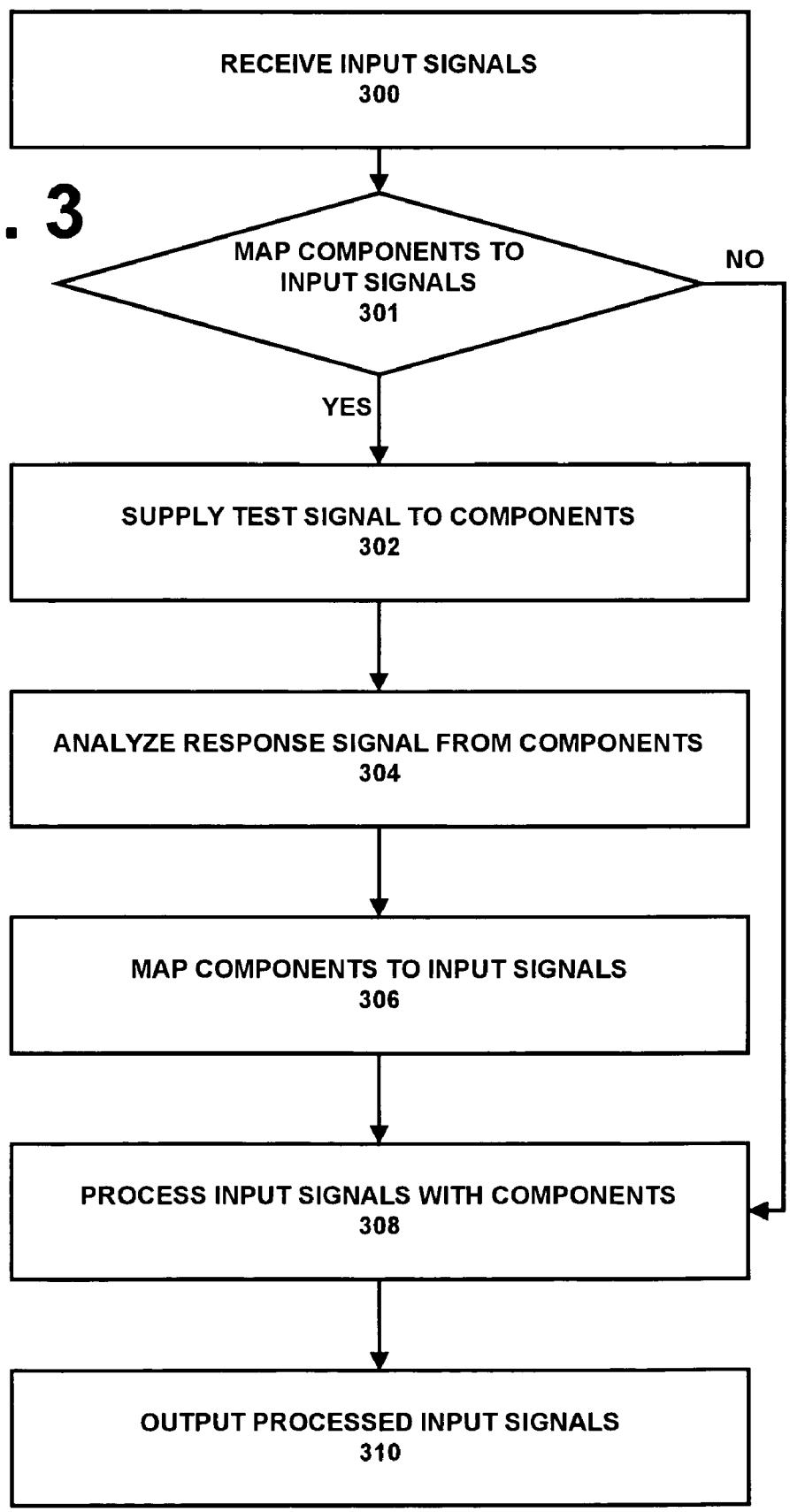

DYNAMIC COMPONENT TO INPUT SIGNAL MAPPING SYSTEM

FIELD OF THE INVENTION

The present invention relates generally to optimizing the use of components with different types of signals. More specifically, the present invention relates to a dynamic mapping of components for use with different types of signals.

BACKGROUND OF THE INVENTION

In the manufacture of semiconductor chips, as known in the prior art, a plurality of components or devices such as memories are formed on a semiconductor substrate. The components on the substrate are then tested, and if a component is non-functional or can not operate within a predetermined criteria, the component is disabled and no longer utilized. This testing occurs during the manufacturing process, and thereafter no further changes of this type can be made to the chip. This is a drawback, especially in the field of video encoder/decoders that use a plurality of analog to digital converters, and digital to analog converters. Having a large plurality of redundant converters results in large chip size and low production yield.

It is thus a drawback of the prior art that the components on a semiconductor chip cannot be dynamically reconfigured for processing different types of signals, such as video and audio signals.

BRIEF DESCRIPTION OF THE DRAWINGS

The features of the present invention which are believed to be novel, are set forth with particularity in the appended claims. The invention, together with further objects and advantages, may be understood by reference to the following description taken in conjunction with the accompanying drawings, and the several figures of which like reference numerals identify like elements.

FIG. 3 is a flow chart depicting the method of the present invention.

DESCRIPTION OF THE PREFERRED EMBODIMENTS

Figure 1:
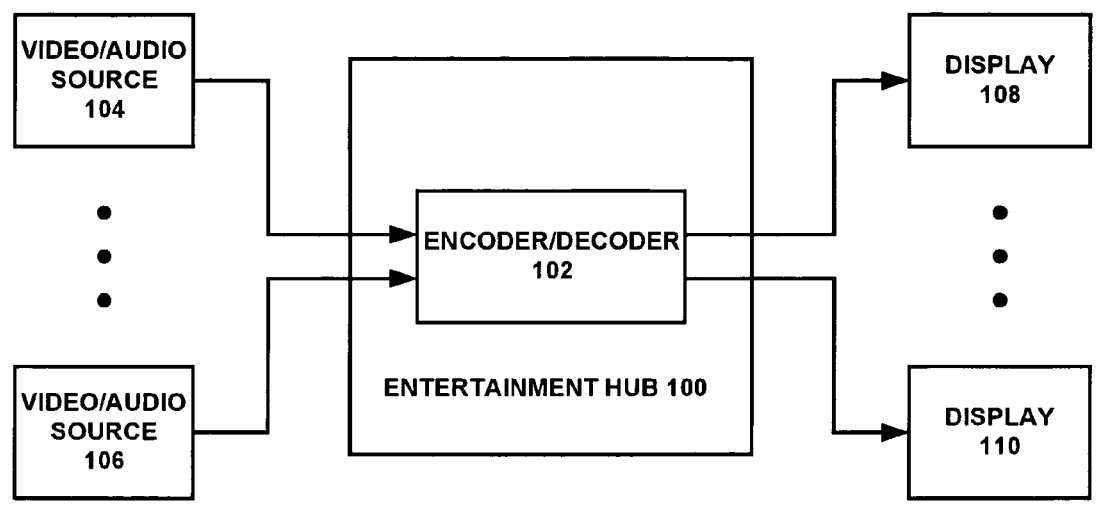
FIG. 1 is a general block diagram of the present invention.

The present invention is directed in part to increasing the yield of semiconductor components. In the prior art, individual memories on a chip are deactivated when they are identified as being defective. With digital components on a chip, the component is either "good" or "bad", as opposed to analog components, which can have degrees of being acceptable. In the case of analog to digital converters (A/Ds), sometimes the A/Ds are linear within original specifications and sometimes they are less linear. A linear A/D is desirable for converting a series of voltages to a series of digital codes. Thus, there can be a range of goodness (degree of linearity) for A/D's, for example.

As an example of the environment of the present invention, there may be a situation in which, at any one time, two A/D's are needed that have a certain quality. During the manufacturing process three A/Ds are formed on a semiconductor substrate, and then at test time if one of the A/Ds is "bad" (does not meet a predetermined criteria) it is eliminated and the other two "good" A/Ds are used. Such applications include encoder/decoder chips for video and I/Q chips for video. For example, the ATI Rage Theater, manufactured by ATI Technologies Inc., is a high quality single chip, multi-standard video encoder/decoder that elevates video on a personal computer and set-top box to a high level of integration, performance and affordability.

According to one embodiment of the present invention, for a television input, a composite input requires only one A/D, but it must have excellent linearity. This is because a composite video signal is a combination of luma and chroma on a single line, and any nonlinearity causes substantial undesired effects. Also there may be a S-video input which needs two A/Ds. Here, linearity is required for the Y part (luminance) of the S-video, but the top 15% (approximately) of the A/D range is never used. Also, for the C part (chrominance) of the S video the top and bottom 15% (approximately) of the A/D range is never used. For YPrPb video, like component video, three A/Ds are required, but linearity is not as critical because there is no mixing of signals. Also the top and bottom 15% (approximately) of the A/D range may never be used.

The present invention is applicable, for example, to a chip that inputs YPrPb and composite video signals. This chip will therefore require three A/Ds. Depending upon the use, which is not restricted to inputting television signals, any number of A/Ds (or any other type of component) can be formed on the semiconductor substrate. In the prior art one of the three A/D's is preselected to be used for composite mode, and the three A/Ds are assigned to always receive respective components of the YPrPb signal. This results in a set mapping of the A/Ds to input pins of the semiconductor chip. However if one or more of the A/Ds is functional, but of lower quality, then the incoming signal will be corrupted. Thus, the prior art has drawbacks in providing quality semiconductor chips with high manufacturing yield.

Since a composite input has high requirements, it is desirable to use the A/D of the three A/Ds in the above example that has the best linearity over the entire operating range of the A/D. The other two A/Ds may have defects that make them unsuitable for receiving a composite video signal, but are suitable for Pr and Pb reception of the YPrPb video signal. Therefore, a test is performed on the A/Ds to determine the suitability of each of the A/Ds with regard to the types of incoming video signals. If a plurality of A/Ds are formed on the semiconductor substrate, completely defective or unacceptable A/Ds are eliminated by blowing fuses, burning EEPROM cells, etc. as is known in the art. This greatly increases the effective yield. Also, at a predetermined point in time, such as when the equipment is turned on, a test module or component produces a test signal, which is applied to the plurality of A/Ds and a new mapping is determined for which A/Ds receive which input signals. Thus, the present invention provides a dynamic mapping of the A/Ds to the input pins for receiving various types of video signals. Test signals and analysis of component responses is well known in the art. For example A/D components use ramp signals or ramp signals with overlaid sine waves as test signals.

The present invention encompasses other components, such as digital to analog converters (D/A), output devices, amplifiers with different bandwidths or phase shifts. Such components are used in satellites and cable modems. For example in cable modems two matched A/Ds are required, as well as, amplifier stages that are matched in gain and phase. Thus, the present invention has many different uses and embodiments. Furthermore, the present invention goes beyond the concept of self-testing for identifying defective components. The present invention actually optimizes the use and connections of the components in the circuitry by grading and regrading the components at different times. This overcomes the problem of components that have changing characteristics over time. Also, the present invention is useable for testing and reconfiguring components, such as resistors and capacitors at the board or system level.

It is to be noted that this allows different types of video input signals to be inputted on a set of pins that are dynamically mapped to different components, such as the A/Ds. The mapping decision can be made each time the equipment is turned on, as well as periodically while the equipment is running (such as when there is a change of television channels), or when some predetermined condition of the equipment changes. Also a test signal can be inserted periodically in real time, such as during the vertical blank portion of a video signal. This has particular utilization in rack mounted equipment that must run for years at a time without maintenance. The dynamic mapping of the present invention overcomes drifting of the equipment over time and temperature. It is thus a feature of the present invention that the remapping occurs without permanently disabling components of the equipment. The test signal can be used to test both linearity and differential gain.

The present invention makes practical a high quality video with integrated IF demodulator and stereo decoder. Such a device is integral for set-top-boxes, PC television, Internet TVs, entertainment/home theater PC, multimedia applications, motion video capture, videoconferencing, video editing, teletext support and VBI data services capture. It can support three input source types, Composite, S-Video (all in NTSC, PAL, and SECAM), and Component video up to 1080 p. A video encoder can deliver high quality NTSC, PAL, or SECAM TV signals in several output formats including Composite, S-Video, RGB, SCART, and Component. It can further incorporate a multi-standard (BTSC, FM—FM, FM-Stereo, NICAM) stereo decoder that delivers 16-bit audio quality at either 32 KHz, 44.1 KHz, 48 KHz or 96 KHz.

FIG. 1 depicts a general embodiment of the present invention. An entertainment hub 100, such as the Rage Theater product described above, has a video and audio encoder/decoder 102 that receives different types of input signals, in particular video input signals, from a plurality of video and audio sources 104, 106. The encoder/decoder 102 outputs video, audio, and/or both video and audio signals to displays 108, 110.

Figure 2:
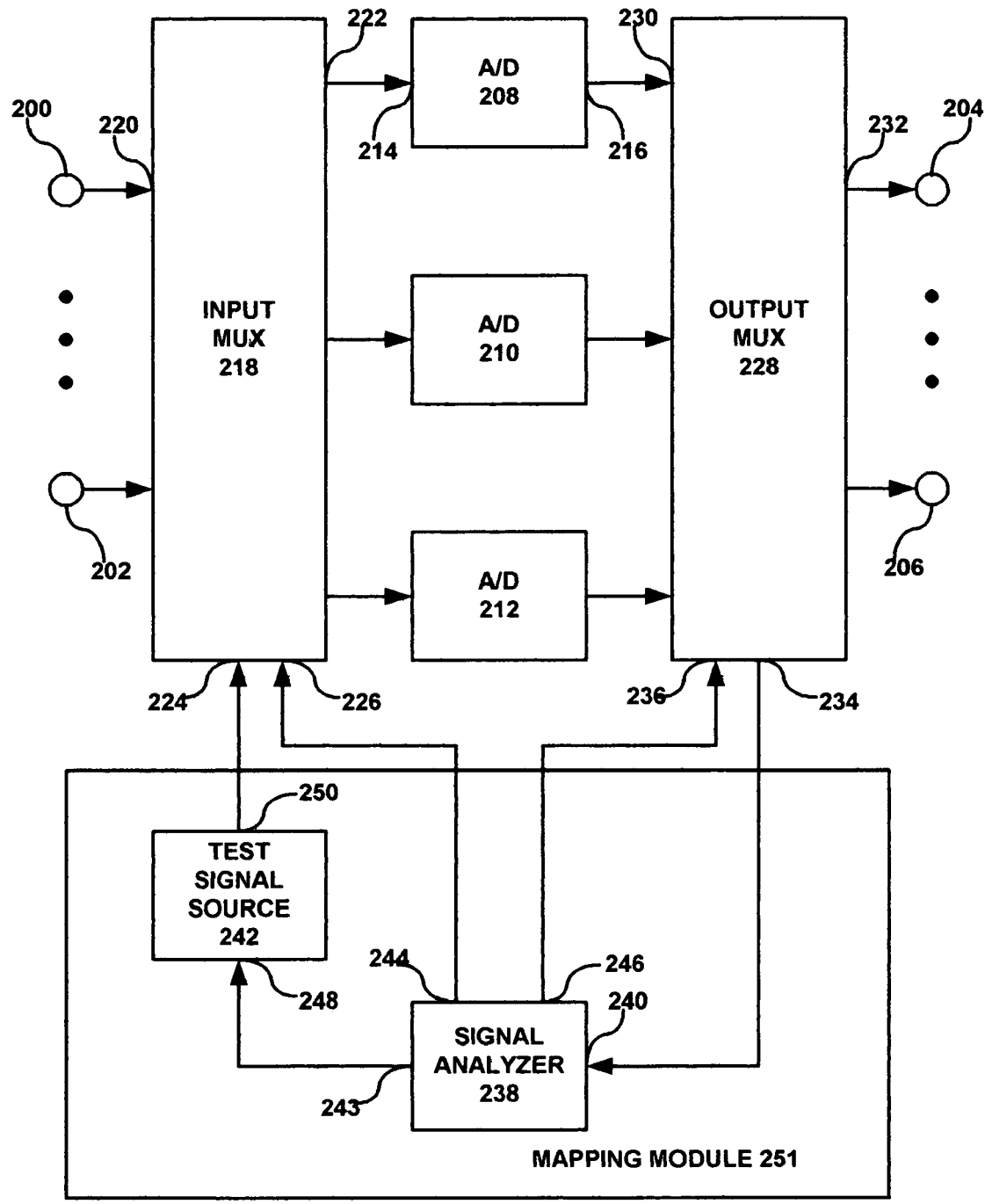
FIG. 2 is a more detailed block diagram of the FIG. 1 system.

FIG. 2 is a more detailed block diagram of the present invention. The present invention is a dynamic component to input signal mapping system for receiving different types of input signals and for providing output signals. A plurality of input ports 200, 202 receive the input signals, and a plurality of output ports 204, 206 provide the output signals. A plurality of components 208, 210, 212 processes the input signals, each of the components 208, 210, 212 have at least one input 214 and one output 216. In the FIG. 2 embodiment each of the components 208, 210, 212 is an analog to digital converter and one of its important parameters is its linearity over an operating range thereof. An input multiplexer 218 has signal inputs 220 respectively connected to the input ports 200, 202, and signal outputs 222 respectively connected to the inputs 214 of the components 208, 210, 212, and a test input 224, and a control input 226. An output multiplexer 228 has signal inputs 230 respectively connected to the outputs 216 of the components 208, 210, 212, and signal outputs 232 respectively connected to the output ports 204, 206, and a test output 234, and a control input 236. A signal analyzer 238 has an input 240 connected to the test output 234 of the output multiplexer 228, an output 243, a first control output 244 connected to the control input 226 of the input multiplexer 218, and a second control output 246 connected to the control input 236 of the output multiplexer 228. A test signal source 242 has an input 248 connected to the output 243 of the signal analyzer 238, and an output 250 connected to the test input 224 of the input multiplexer 218. The signal analyzer 238 maps connections of the components 208, 210, 212 to the input ports 200, 202 and output ports 204, 206 via the input and output multiplexers 218, 228 as a function of an operational test of the components 208, 210, 212 by the signal analyzer 238 using test signals supplied by the test signal source 242 and based on the different types of input signals. In one embodiment the input multiplexer 218 is an analog crosspoint switch and the output multiplexer 228 is a digital crosspoint switch.

The signal analyzer 238 and the test signal source 242 form a mapping module 251. It is to be understood that the mapping module 251 could be implemented in various other ways with different components. The mapping module 251 performs the function of mapping of the components 208, 210, 212 to the input ports 200, 202 and output ports 204, 206. This mapping is performed periodically during operation of the system, or during initialization of the system. Typically, the mapping is performed at least once during operation of the system.

When the components 208, 210, 212 are analog to digital converters, the test signal source 242 outputs a linear ramp signal or a linear ramp signal with an overlaid sine wave as is known in the art for testing response characteristics of analog to digital converters. It is to be noted that the present invention can be used with any number of components and inputs signal types as discussed above. The signal analyzer 238 analyzes each of the analog to digital converters for at least linearity within a respective operating range of each of the converters. Numerous types of signal analyzers are known in the art. As also discussed above, the input signals at input ports 200–202 are at least one of composite video signals, S-video signals, and YPbPr video signals. The test signal from the test signal source 242 is a signal suitable for testing the components 208, 210, and 212 for the various types of signal processing that is required by the equipment in which the components 208,210, and 212 are used.

The present invention maps the analog to digital components to the different types of input signals. Since this is a dynamic mapping, the association of the analog to digital converters to a particular type of input signal may change with time and temperature changes, for example. Thus, a composite video signal requires an analog to digital converter that has a characteristic of being very linear over its entire operating range. This input signal may be mapped to a first converter until it degrades in performance below that of a another converter. At that time the present invention remaps the input signal to the other converter. The first converter may then be used for other types of video input signals, such as S-video.

FIG. 3 is a flowchart depicting operation of the present invention. The present invention is a method for dynamically mapping components in a system to different types of input signals received by the system. In step 300 input signals are received at a plurality of input ports. In step 301 a determination is made regarding mapping of the components to the type of received input signals. As discussed above, remapping of the components to the input signals can occur when the equipment is turned on, or at set times, or periodically, or in response to the occurrence of predetermined conditions, such as a temperature deviation. A test signal is supplied in step 302 to the input multiplexer, which supplies the test signal to each of the components. A respective response signal from each of the components, via the output multiplexer, is analyzed in step 304. Connections of the components are mapped to the input and output ports via the input and output multiplexers as a function the analyzed response signals and based on the different types of input signals (see step 306). The input signals are then processed in step 308 by the components. Finally, the processed signals are output in step 310.

The present invention overcomes the drawbacks of the prior art approach in that the components on a semiconductor chip can be dynamically reconfigured for optimal processing of different types of signals, such as video and audio signals.

The invention is not limited to the particular details of the apparatus as depicted and other modifications and applications are contemplated. Certain other changes may be made in the above-described apparatus and method without departing from the true spirit and scope of the invention herein involved. It is intended, therefore, that the subject matter in the above depiction shall be interpreted as illustrative and not in a limiting sense.

What is claimed is:

1. A dynamic component to input signal mapping system for receiving different types of input signals and for providing output signals, comprising:
   a plurality of input ports for receiving the input signals;
   a plurality of output ports for providing the output signals;
   a plurality of components for processing the input signals, each of the components having at least one input and one output;
   an input multiplexer having signal inputs respectively connected to the input ports, and signal outputs respectively connected to the inputs of the components, and a test input, and a control input;
   an output multiplexer having signal inputs respectively connected to the outputs of the components, and signal outputs respectively connected to the output ports, and a test output, and a control input;
   a signal analyzer having an input connected to the test output of the output multiplexer, an output, a first control output connected to the control input of the input multiplexer, a second control output connected to the control input of the output multiplexer, and having a third output;
   a test signal source having an input connected to the third output of the signal analyzer, and an output connected to the test input of the input multiplexer;
   wherein the signal analyzer maps connections of the components to the input and output ports via the input and output multiplexers as a function of an operational test of the components by the signal analyzer using test signals supplied by the test signal source and based on the different types of input signals.

2. The system according to claim 1, wherein the mapping of the components to the input and output ports is performed periodically during operation of the system.

3. The system according to claim 1, wherein the mapping of the components to the input and output ports is performed during initialization of the system.

4. The system according to claim 1, wherein the mapping of the components to the input and output ports is performed at least once during operation of the system.

5. The system according to claim 1, wherein the components are analog to digital converters.

6. The system according to claim 1, wherein the input multiplexer is an analog crosspoint switch.

7. The system according to claim 1, wherein the output multiplexer is a digital crosspoint switch.

8. The system according to claim 1, wherein the test signal source outputs a linear ramp signal.

9. The system according to claim 8, wherein the linear ramp signal is sent to the input multiplexer during at least one vertical blank portion of a video signal that is received at the input ports.

10. The system according to claim 1, wherein the test signal source outputs a linear ramp signal with an overlaid sine wave.

11. The system according to claim 10, wherein the linear ramp signal is sent to the input multiplexer during at least one vertical blank portion of a video signal that is received at the input ports.

12. The system according to claim 1, wherein the signal analyzer analyzes each of the components for at least linearity within a respective operating range of each of the components.

13. The system according to claim 1, wherein the input signals consist of at least one of composite video signal, S-video signal, and YPbPr video signal.

14. A dynamic component to input signal mapping system for receiving different types of input signals and for providing output signals, comprising:
   a plurality of input ports for receiving the input signals;
   a plurality of output ports for providing the output signals;
   a plurality of components for processing the input signals, each of the components having at least one input and one output, and each of the components having at least one characteristic;
   an input multiplexer having signal inputs respectively connected to the input ports, and signal outputs respectively connected to the inputs of the components;
   an output multiplexer having signal inputs respectively connected to the outputs of the components, and signal outputs respectively connected to the output ports;
   a mapping module for mapping and remapping an association of respective components with respective input signals during operation of the system, the mapping module being connected to the input and output multiplexers; and
   wherein the input multiplexer has a test input and a control input, wherein the output multiplexer has a test output and a control input, and wherein the mapping module comprises:
   a signal analyzer having an input connected to the test output of the output multiplexer, an output, a first control output connected to the control input of the input multiplexer, a second control output connected to the control input of the output multiplexer, and a third output;
   a test signal source having an input connected to the third output of the signal analyzer, and an output connected to the test input of the input multiplexer;
   wherein the signal analyzer maps connections of the components to the input and output ports via the input and output multiplexers as a function of an operational test of the components by the signal analyzer using test signals supplied by the test signal source and based on the different types of input signals.

15. The system according to claim 14, wherein the mapping of the components to the input and output ports is performed periodically during operation of the system.

16. The system according to claim 14, wherein the mapping of the components to the input and output ports is performed during initialization of the system.

17. The system according to claim 14, wherein the mapping of the components to the input and output ports is performed at least once during operation of the system.

18. The system according to claim 14, wherein the components are analog to digital converters, and wherein the input multiplexer is an analog crosspoint switch and the output multiplexer is a digital crosspoint switch.

19. The system according to claim 14, wherein the test signal source outputs a linear ramp signal.

20. The system according to claim 19, wherein the linear ramp signal is sent to the input multiplexer during at least one vertical blank portion of a video signal that is received at the input ports.

21. The system according to claim 14, wherein the test signal source outputs a linear ramp signal with an overlaid sine wave.

22. The system according to claim 21, wherein the linear ramp signal is sent to the input multiplexer during at least one vertical blank portion of a video signal that is received at the input ports.

23. The system according to claim 14, wherein the signal analyzer analyzes each of the components for at least linearity within a respective operating range of each of the components.

24. The system according to claim 14, wherein the input signals consist of at least one of composite video signal, S-video signal, and YpbPr video signal.

25. A method for dynamically mapping components in a system to input signals received by the system, comprising the steps of:
receiving at least one input signal of a set of predetermined input signals;
providing a test signal to each of a plurality of components;
analyzing a respective response signal output by each component respectively in response to the test signal; and
mapping at least one component of the plurality of components to receive the at least one input signal based on the analyzed response signal of the components and on the set of predetermined input signals.

26. The method according to claim 25, wherein the mapping of the components is performed periodically during operation of the system.

27. The method according to claim 25, wherein the mapping of the components is performed during initialization of the system.

28. The method according to claim 25, wherein the mapping of the components is performed at least once during operation of the system.

29. The method according to claim 25, wherein the components are analog to digital converters.

30. The method according to claim 25, wherein the input signals consist of at least one of composite video signal, S-video signal, and YPbPr video signal.

31. A method for dynamically mapping components in a system to different types of input signals received by the system, comprising the steps of:
receiving at a plurality of input ports the input signals;
providing at a plurality of output ports the output signals;
providing a plurality of components for processing the input signals, each of the components having at least one input and one output;
providing an input multiplexer having signal inputs respectively connected to the input ports, and signal outputs respectively connected to the inputs of the components, and a test input, and a control input;
providing an output multiplexer having signal inputs respectively connected to the outputs of the components, and signal outputs respectively connected to the output ports, and a test output, and a control input;
supplying a test signal to the input multiplexer, which supplies the test signal to each of the components;
analyzing a respective response signal from each of the components via the output multiplexer;
mapping connections of the components to the input and output ports via the input and output multiplexers as a function the analyzed response signals and based on the different types of input signals.

32. The method according to claim 31, wherein the mapping of the components is performed periodically during operation of the system.

33. The method according to claim 31, wherein the mapping of the components is performed during initialization of the system.

34. The method according to claim 31, wherein the mapping of the components is performed at least once during operation of the system.

35. The method according to claim 31, wherein the components are analog to digital converters.

36. The method according to claim 31, wherein the input signals consist of at least one of composite video signal, S-video signal, and YPbPr video signal.

37. A dynamic component to input signal mapping system for receiving different types of input signals comprising:
a plurality of input ports for receiving input signals;
a plurality of output ports for providing output signals;
a plurality of components for processing the input signals, each of the components having at least one input and one output;
a test signal source operatively coupled to the plurality of components;
a signal analyzer operatively coupled to an output of the components and operative to analyze a respective response signal output by each component based in response to the test signals; and
operative to map at least one component of the plurality of components to receive at least one input signal based on the analyzed response signal of the components.

38. The system of claim 37, wherein the input signals comprise of at least one of a composite video signal, S-video signal and YpbPr video signal and wherein the components include analog to digital converters.

* * * * *